(12) United States Patent
Li

(10) Patent No.: US 10,614,905 B2
(45) Date of Patent: Apr. 7, 2020

(54) SYSTEM FOR TESTING MEMORY AND METHOD THEREOF

(71) Applicants: Inventec (Pudong) Technology Corporation, Shanghai (CN); Inventec Corporation, Taipei (TW)

(72) Inventor: Yen Li, Shanghai (CN)

(73) Assignee: INVENTEC (PUDONG) TECHNOLOGY CORPORATION, Taipei (TW)

( * ) Notice: Subject to any disclaimer, the term of this patent is extended or adjusted under 35 U.S.C. 154(b) by 106 days.

(21) Appl. No.: 16/009,548

(22) Filed: Jun. 15, 2018

(65) Prior Publication Data

US 2019/0180838 A1 Jun. 13, 2019

(30) Foreign Application Priority Data

Dec. 8, 2017 (CN) .......................... 2017 1 1294684

(51) Int. Cl.
| | |
|---|---|
| *G11C 29/00* | (2006.01) |
| *G11C 29/42* | (2006.01) |
| *G11C 29/44* | (2006.01) |
| *G06F 11/10* | (2006.01) |
| *G06F 12/10* | (2016.01) |
| *G11C 29/52* | (2006.01) |

(Continued)

(52) U.S. Cl.
CPC .......... *G11C 29/42* (2013.01); *G06F 11/1068* (2013.01); *G06F 12/10* (2013.01); *G11C 5/04* (2013.01); *G11C 29/08* (2013.01); *G11C 29/18* (2013.01); *G11C 29/44* (2013.01); *G11C 29/52* (2013.01); *G06F 2212/1032* (2013.01); *G06F 2212/657* (2013.01); *G11C 8/06* (2013.01)

(58) Field of Classification Search
None
See application file for complete search history.

(56) References Cited

U.S. PATENT DOCUMENTS

| | | | |
|---|---|---|---|
| 9,043,638 B1* | 5/2015 | Su ........................ | G06F 11/073 714/6.1 |
| 2012/0011299 A1* | 1/2012 | Mylly ................. | G06F 12/0246 711/103 |

(Continued)

OTHER PUBLICATIONS

G. Kornaros et al., "Hardware Support for Cost-Effective System-Level Protection in Multi-core SoCs," 2015 Euromicro Conference on Digital System Design, Funchal, 2015, pp. 41-48.doi: 10.1109/DSD.2015.65 (Year: 2015).*

*Primary Examiner* — Daniel F. McMahon
(74) *Attorney, Agent, or Firm* — David R. Stevens; Stevens Law Group

(57) ABSTRACT

A system for testing memory and a method thereof are disclosed. In the system, a physical address range of at least one memory module is converted into a logical address range of the memory, and a read and write test is performed on the memory according to the logical address range of the memory, and an error message corresponding to the memory is detected during the read and write test, and a logical address contained in the error message is converted into a physical address of the memory module corresponding to the logical address, so as to improve test coverage and validity of memory test, and effectively determine the problematic memory module, thereby achieving the technical effect of preventing the test program from being closed by the operating system.

10 Claims, 2 Drawing Sheets

(51) Int. Cl.
*G11C 5/04* (2006.01)
*G11C 29/08* (2006.01)
*G11C 29/18* (2006.01)
*G11C 8/06* (2006.01)

(56) References Cited

U.S. PATENT DOCUMENTS

| | | | |
|---|---|---|---|
| 2012/0210095 A1* | 8/2012 | Nellans | G06F 12/10 |
| | | | 711/206 |
| 2013/0117493 A1* | 5/2013 | Skalsky | G06F 12/0646 |
| | | | 711/5 |
| 2013/0275656 A1* | 10/2013 | Talagala | G06F 12/0246 |
| | | | 711/103 |
| 2014/0325115 A1* | 10/2014 | Ramsundar | G06F 12/0238 |
| | | | 711/102 |
| 2014/0359395 A1* | 12/2014 | Ellis | G06F 11/1016 |
| | | | 714/763 |
| 2016/0266975 A1* | 9/2016 | Hu | G06F 12/1009 |
| 2018/0189508 A1* | 7/2018 | Li | G06F 21/6218 |
| 2019/0138445 A1* | 5/2019 | Lee | G06F 12/0246 |

* cited by examiner

SYSTEM FOR TESTING MEMORY AND METHOD THEREOF

CROSS-REFERENCE TO RELATED APPLICATION

This application claims the benefit of Chinese Patent Application No. 201711294684.0, filed Dec. 8, 2017.

BACKGROUND OF THE INVENTION

1. Field of the Invention

The present invention generally relates to a test system and a method thereof, more particularly to a system for testing memory and a method thereof.

2. Description of the Related Art

With the continuous improvement of semiconductor manufacturing technology, the design scale of integrated circuit (IC) is getting larger and larger, and there are more types of defects that may exist in highly complex ICs such as memories, processors, and North-South bridges. On the other hand, with the increase in the complexity of ICs, a significant amount of IC products, especially memories, are used in computing devices such as servers, desktop or notebook computers, mobile devices, and consumer and commercial electronic servers, and so on.

In the process of operating the computing device, if a memory error occurs, it possibly results in erroneous results and causes the application to be closed, or even crashes the computing device. It is important that some computing devices, such as servers, require high stability. Since the stability of the memory may greatly affect that of the computing device, the memory testing is a necessary process for improvement in the stability of the server.

In recent years, the memory test manners include the process of separately testing a memory module, the process of using BIOS to test the memory module installed in the computing device, and the process of testing the memory when the operating system of the computing device runs. Most manufacturers usually use a RAM Stress Test (RST) program to execute the process of testing the memory when the operating system of the computing device runs. The RST program is able to test the stability of the memory but is also time-consuming, and the memory test in the operating system is unable to test the memory completely. Furthermore, when the RST program finds an error during the test, the RST program only provides the error memory address but is unable to indicate which memory module has the error.

In summary, what is needed is to develop an improved technical solution to solve the conventional problem of low test coverage, poor validity, and inability to effectively determine a problematic memory module in the RST program.

SUMMARY OF THE INVENTION

In order to solve the conventional problem that the RST program may be closed by the operating system, the present invention is to provide a system for testing memory and a method thereof.

According to an embodiment, the present invention provides a system for testing memory, and the system can be applied to an operating system executed by a computing device, and the computing device comprises at least one memory module, which is served as a memory. The system comprises an address mapping module configured to set up mapping information which comprises a corresponding relationship between a logical address range of the memory and a physical address range of the at least one memory module; a data access module configured to divide the physical address range of the at least one memory module into a plurality of small units, and convert the physical address range of each of the plurality of small units into a test address range according to the mapping information, and generate a plurality of test threads as many as processing cores of the computing device, and assign each of the plurality of test threads to perform a read and write test for the test address range corresponding to at least one of the plurality of small units; a error detection module configured to detect an error message corresponding to the memory and generated during the read and write test; an error report module configured to convert, according to the mapping information, a logical address contained in the error message into a physical address of the memory module corresponding thereto, and generate module information of the memory module corresponding to the logical address, and output the physical address and the module information.

According to an embodiment, the present invention provides a method for testing memory, and the method is applied to an operating system executed by a computing device which comprises at least one memory module served as a memory. The method comprises following steps of: setting up mapping information which comprises a corresponding relationship between a physical address range of the at least one memory module and a logical address range of the memory; according to the mapping information, converting the physical address range of the at least one memory module into the logical address range of the memory, and performing a read and write test on the memory according to the logical address range of the memory; detecting an error message corresponding to the memory and generated during the read and write test; according to the mapping information, converting a logical address contained in the error message into a physical address of the memory module corresponding thereto, and generating module information of the memory module corresponding to the logical address; and, outputting the physical address and the module information.

According above content, the difference between the technology of the present invention and the conventional technology is that, in the system and the method of the present invention, the physical address range of the at least one memory module can be converted into the logical address range of the memory, and a read and write test is performed on the memory according to the logical address range of the memory, and the error message corresponding to the memory is detected during the read and write test, and the logical address contained in the error message can be converted into the physical address of the memory module corresponding thereto, so as to solve conventional problem and achieve the technical effect of preventing the test program from being closed by the operating system.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
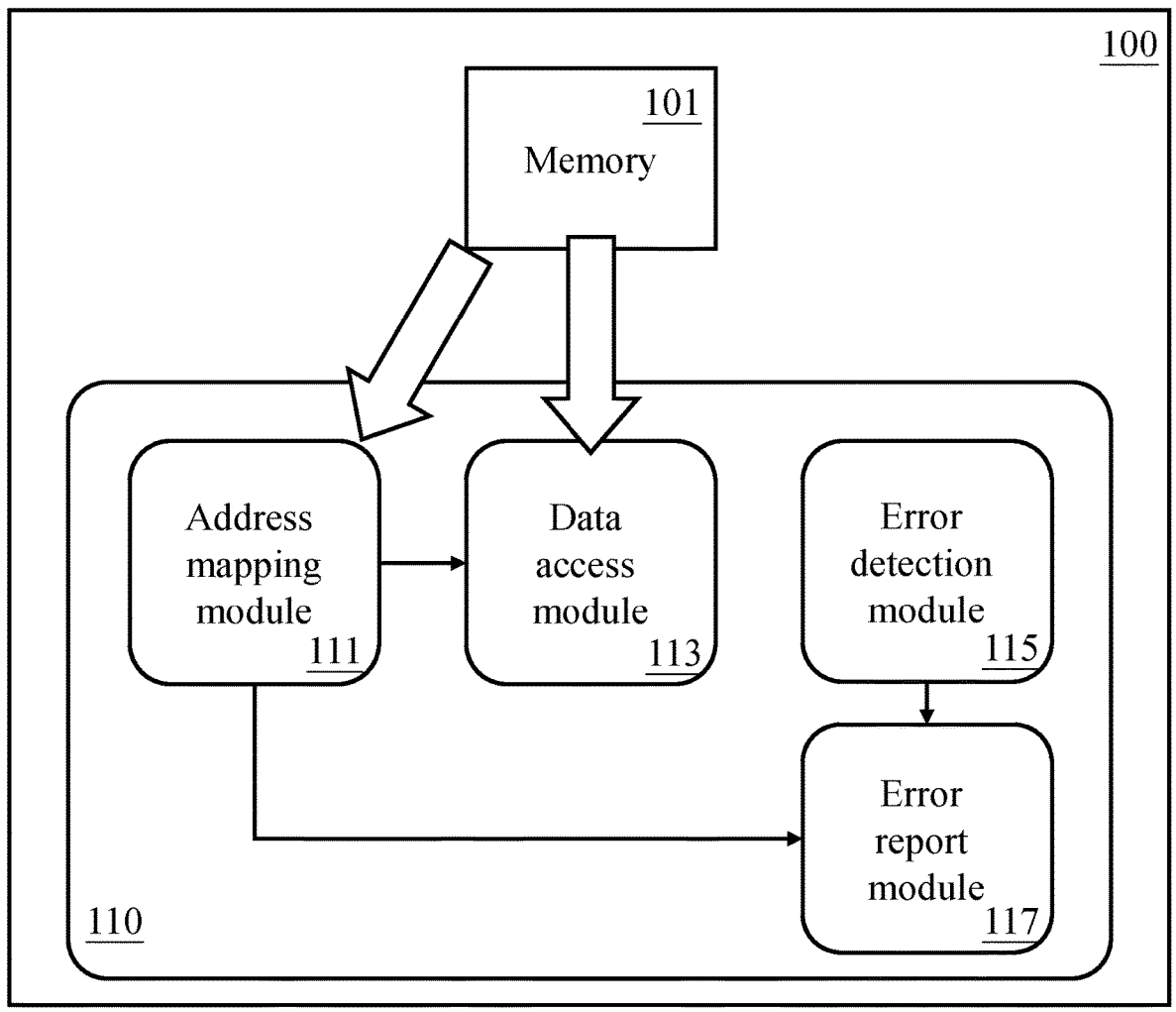
FIG. 1 is a structural view of a system for testing memory, according to an embodiment of the present invention.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

The system and the method of the present invention can be executed in an operating system, by assigning a physical address range of a memory module, a memory can be divided into a plurality of small unit for performing a read and write test, and the error message corresponding to the memory is detected during the read and write test. In this way, when the error message is detected, the memory module with a read/write error is determined based on the error message.

The following illustrates the operation of the system of the present invention with reference to FIG. 1, which is a structural view of a system for testing memory, according to an embodiment of the present invention. As shown in FIG. 1, the system includes an address mapping module 111, a data access module 113, an error detection module 115, and an error report module 117.

The address mapping module 111 is configured to set up mapping information. The mapping information comprises a corresponding relationship between a logical address range of the memory 101 and a physical address range of a memory module installed in the computing device 100. For example, in a condition that two memory modules (4G and 8G) are installed in the computing device 100, the logical address range of the memory 101 is 0x0 to 0xBFFFFFFFFF, the physical address range of the first memory module is 0x0 to 0xBFFFFFFFF, and corresponds to the logical address range of 0x0 to 0x3FFFFFFFFF of the memory 101; and, the physical address range of the second memory module is 0x0 to 0x7FFFFFFFF, and corresponds to the logical address range of 0xC000000000 to 0xBFFFFFFFFF of the memory 101.

In general, according to the data recorded in a serial presence detect (SPD) chip of the memory module, the setting information recorded by the computing device 100 or the operating system 110, or user's setting information, the address mapping module 111 can obtain a capacity of the memory module installed in the computing device 100; furthermore, the address mapping module 111 can obtain an initialization sequence of the memory module, and determine the physical address range of the memory module according to the capacity and sequence of the memory module, so as to set up the mapping information. Preferably, the initialization sequence may be formed by the slot numbers where the memory modules are installed; however, the present invention is not limited thereto.

The data access module 113 is configured to perform a read and write test on the memory 101. The data access module 113 can first obtain the physical address range of the memory module on which the read and write test is to be performed, and according to the mapping information generated by the address mapping module 111, the data access module 113 can convert the physical address range of the memory module into the logical address range of the memory 101, and perform the read and write test on the memory 101 according to the converted logical address range of the memory 101. The logical address range of the memory 101 on which the read and write test is performed by the data access module 113 is referred as a test address range, in the embodiment of the present invention.

In order to increase efficiency of the read and write test, the data access module 113 can divide the physical address range of each memory module into a plurality of small units having a smaller address range, and then convert, according to the mapping information generated by the address mapping module 111, the address range of each small unit into the test address range of the memory 101; furthermore, the data access module 113 can also generate a plurality of test threads as many as processing cores of the computing device 100, and assign all test address ranges to each test thread, so that each test thread can be assigned with at least one small unit and perform the read and write test for the test address range corresponding to the small unit assigned thereto. Each test thread can use Match Pattern manner to perform read and write test for the test address range corresponding to the small unit, for example, the Match Pattern manner includes operations of ↑(W0), ↑(R0,W1), ↓ (R1,W0), ↓(R0,W1), ↑(R1,W0), ↓(R0,W1), ↓(R1,W0), ↑(R0,W1) and ↑R1, wherein W represents an operation of writing data, and R represents an operation of reading and comparing data, the symbol "↑" represents an ascending order and the symbol "↓" represents a descending order. The number 0 represents "vector 0", and the number 1 represent "vector 1"; for example, ↑(W0) represent the operation of writing vector 0 in the ascending order, ↑(R0,W1) represents the operation of reading data and comparing whether the data is the same as the vector 0,and then writing the vector 1 in the ascending order, and so forth. It is to be noted that there are five sets of vectors 0 and vectors 1, the first set is 0000000000000000 and FFFFFFFFFFFFFFFF, the second set is 0F0F0F0F0F0F0F0F and F0F0F0F0F0F0F0F0, the third set is 5555555555555555 and AAAAAAAAAAAAAAAA, the fourth set is 3333333333333333 and CCCCCCCCCCCCCCCC, and the fifth set is 7777777777777777 and 8888888888888888. The test thread can use the five sets of vectors 0 and vectors 1, in a sequential order, to perform the read and write test for the address range corresponding to the same small unit, respectively.

In general, the data access module 113 can generate a user program and a core program. The user program can be used to access specific logical address of the memory 101, for example, the above-mentioned test thread. The core program can be used to assign the physical address range of the memory module on which the read and write test is performed, and convert, according to the mapping information generated by the address mapping module 111, the assigned physical address range of the memory module into a logical address range (that is, test address range) of the memory, so that the user program can perform the read and write test according to the logical address range. Furthermore, after the user program completes the read and write test, the core program can free the logical address range under the read and write test, and also free the physical address range corresponding to the logical address range under the read and write test performed by the user program.

In some embodiments, the data access module 113 can disable cache mechanism of the computing device 100, to indeed perform the read and write test in the memory 101.

The error detection module 115 is configured to detect whether error message corresponding to the memory 101 is generated while the read and write test is being performed on the data access module 113.

In general, the error detection module 115 can monitor an error checking & correcting counter (ECC) counter of the memory 101, monitor a system event log (SEL) of a baseboard management controller (BMC) of the computing device 100, a startup (booting) message generated by the operating system 110, and/or monitor a hardware diagnostic record generated by the operating system 110, so as to detect whether the error message corresponding to the memory 101 is generated.

The error report module 117 is configured to convert, according to the mapping information set up by the address mapping module 111, a logical address contained in the error message detected by the error detection module 115 into a physical address of the memory module corresponding to the logical address.

The error report module 117 also generates module information of the memory module corresponding to the logical address contained in the error message detected by the error detection module 115. Preferably, the data of memory module can be checked easily according to the module information generated by the error report module 117; for example, the module information can comprise the data which is available from the SPD chip of the memory module, and the data includes manufacturer information, a model number, a serial number of the memory module; and, the module information can also comprise a slot number or a slot position of the memory slot where the memory module is mounted.

The error report module 117 also outputs the converted physical address and the generated module information.

Figure 2:
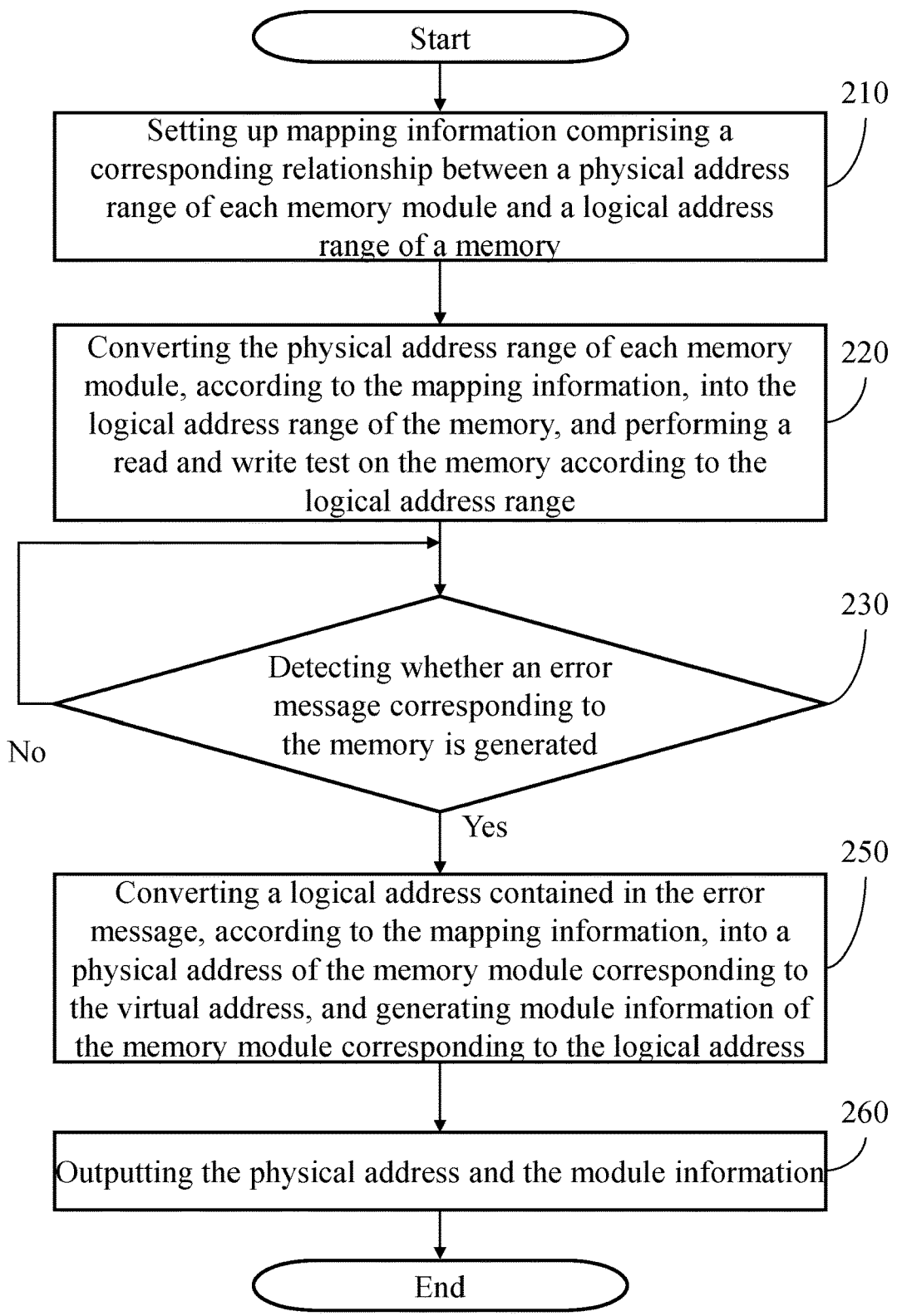
FIG. 2 is a flow chart of a method for testing memory, according to an embodiment of the present invention.

Next, an operation of the method of the present invention is illustrated according to an embodiment. Please refer to FIG. 2, which is a flow chart of a method for testing memory, according to an embodiment of the present invention. In this embodiment, the computing device 100 is a server, and four 16G memory modules are installed in the computing device 100.

In the step 210, after the operating system 110 of the computing device 100 is booted, the user can execute the application program of the present invention in the operating system 110, and the address mapping module 111 can set up the corresponding relationship between the physical address range of each memory module and the logical address range of the memory 101.

Next, in the step 220, the data access module 113 converts, according to the mapping information set up by the address mapping module 111, the physical address range of each memory module into the logical address range of the memory 101, and performs the read and write test on the memory 101 according to the converted logical address range of the memory 101. In this embodiment, suppose that the data access module 113 can call the core program, and after the core program is executed, the physical address range of each memory module is divided into the plurality of small units, that is, the memory 101 is divided into the plurality of small units; next, the physical address range of each small unit is converted into the corresponding logical address range (that is, test address range), according to the mapping information generated by the address mapping module 111. Next, the data access module 113 can call the user program, and after the user program is executed, the plurality of test threads as many as the processing cores of the computing device 100 are generated, and all small units are uniformly assigned to the test threads, so that each test thread can perform the read and write test on the test address range of the small unit assigned thereto. After each test thread completes the read and write test for the small unit, the core program can first free the test address range (the logical address range) corresponding to the small unit which completes the read and write test, and then free the address range (physical address range) of the small unit in which the read and write test is completed.

In the step 230, while the data access module 113 performs the read and write test on the memory 101, the error detection module 115 can continuously detect whether the error message corresponding to the memory 101 is generated until the data access module 113 completes the read and write test on the memory 101. In this embodiment, suppose that the error detection module 115 is to monitor the ECC counter of the memory 101, monitor SEL of the BMC of the computing device 100, use a dmesg instruction to check the startup message generated by the operating system 110, and/or monitor the hardware diagnostic record (such as mcelog) generated by the operating system 110.

When the error detection module 115 detects no error message corresponding to the memory 101 during the process that the data access module 113 performs the read and write test on the memory 101, the error report module 117 can not work. When the error detection module 115 detects the error message corresponding to the memory 101 during the process that the data access module 113 performs the read and write test on the memory 101, in the step 250, the error report module 117 can convert, according to the mapping information set by the address mapping module 111, the logical address contained in the detected error message into the physical address of the memory module corresponding to the logical address, and then generate the module information of the memory module corresponding to the logical address contained in the error message; and, in the step 260, the error report module 117 can output the module information and the converted physical address of the memory module.

According to the system and the method of the present invention, the read and write test can be performed on the memory one by one according to the physical address ranges of the memory modules, so as to completely test the memory other that the memory which is allocated for the operating system 110, thereby preventing the problem that the operating system 110 may delete the memory test program in an insufficient memory condition because the memory test program occupies too much memory during the testing process.

In the embodiment, when the data access module 113 performs the read and write test on the memory 101 (that is, the step 220), or in detail, before the test thread performs the read and write test on the test address range assigned thereto, the core program can disable the cache mechanism of the computing device 100; and, after the test thread completes the read and write test, the core program enable the cache mechanism of the computing device 100.

In summary, the difference between the technology of the present invention and the conventional technology is that, in the system of the method of the present invention, the physical address range of the at least one memory module can be converted into the logical address range of the memory, and the read and write test is performed on the memory according to the logical address range of the memory, and the error message corresponding to the memory is detected during the read and write test, and the logical address contained in the error message can be converted into the physical address of the memory module corresponding thereto. As a result, this technical solution can solve the conventional problem that test coverage and validity of the memory stress test program are too low to effectively determine the problematic memory module, and achieve the technical effect of preventing the test program from being closed by the operating system.

In an embodiment, the system and the method for testing memory of the present invention can be implemented by hardware, software or a combination thereof, and can be implemented by a centralization manner, or by a distribution manner using different components distributed in interconnected computer systems.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A system for testing memory, applied to an operating system executed by a computing device, and the computing device comprising at least one memory module served as a memory of the computing device, and the system comprising:
    an address mapping module configured to set up mapping information, wherein the mapping information comprises a corresponding relationship between a logical address range of the memory and a physical address range of the at least one memory module;
    a data access module configured to divide the physical address range of the at least one memory module into a plurality of small units, and convert the physical address range of each of the plurality of small units into a test address range according to the mapping information, and generate a plurality of test threads as many as processing cores of the computing device, and assign each of the plurality of test threads to perform a read and write test for the test address range corresponding to at least one of the plurality of small units;
    an error detection module configured to detect an error message corresponding to the memory and generated during the read and write test; and
    an error report module configured to convert, according to the mapping information, a logical address contained in the error message into a physical address of the at least one memory module corresponding thereto, and generate module information of the at least one memory module corresponding to the logical address, and output the physical address and the module information.

2. The system according to claim 1, wherein the error detection module is configured to monitor an error checking & correcting (ECC) counter of the memory, monitor a system event log (SEL) of a baseboard management controller (BMC) of the computing device, check a startup message of the operating system, and/or monitor a hardware diagnostic record of the operating system, so as to detect the error message.

3. The system according to claim 1, wherein the data access module is configured to disable cache mechanism of the computing device.

4. The system according to claim 1, wherein the address mapping module obtains the physical address range of the at least one memory module according to data recorded in a serial presence detect (SPD) chip of the at least one memory module, setting information recorded by the computing device or the operating system, or user's setting information.

5. The system according to claim 1, wherein the module information comprises manufacturer information, a model number, a serial number, and/or a slot position.

6. A method for testing memory, applied to an operating system executed by a computing device comprising at least one memory module served as a memory of the computing device, and the method comprising:
    setting up mapping information comprising a corresponding relationship between a physical address range of the at least one memory module and a logical address range of the memory;
    converting the physical address range of the at least one memory module, according to the mapping information, into the logical address range of the memory, and performing a read and write test on the memory according to the logical address range of the memory;
    detecting an error message corresponding to the memory and generated during the read and write test;
    converting a logical address contained in the error message, according to the mapping information, into a physical address of the memory module corresponding thereto, and generating module information of the memory module corresponding to the logical address; and
    outputting the physical address and the module information.

7. The method according to claim 6, wherein the step of converting the physical address range of the at least one memory module into the logical address range of the memory according to the mapping information, and performing the read and write test on the memory according to the logical address range of the memory, comprises:
    dividing the physical address range of each of the at least one memory module into a plurality of small units;

converting the physical address range of each of the plurality of small units into a test address range according to the mapping information;

generating a plurality of test threads as many as processing cores of the computing device; and assigning each of the plurality of test threads to perform the read and write test for the test address range corresponding to at least one of the plurality of small units.

8. The method according to claim 6, wherein the step of detecting the error message corresponding to the memory and generated during the read and write test, further comprises:

monitoring an ECC counter of the memory, monitoring an SEL of a BMC of the computing device, checking a startup message of the operating system, and/or monitoring a hardware diagnostic record of the operating system.

9. The method according to claim 6, wherein the step of performing the read and write test on the memory, further comprises:

disabling cache mechanism of the computing device.

10. The method according to claim 6, wherein the step of setting up the mapping information, comprises:

obtaining the physical address range of the at least one memory module, according to data recorded in an SPD chip of the at least one memory module, setting information recorded by the computing device or the operating system, or user's setting information.

* * * * *